US007038229B2

(12) United States Patent
Jung et al.

(10) Patent No.: US 7,038,229 B2

(45) Date of Patent: May 2, 2006

(54) ELECTRIC SWITCHING DEVICE AND ELECTRIC CIRCUIT DEVICE HAVING THE SAME

(75) Inventors: Moon Youn Jung, Daejeon (KR); Chi Hoon Jun, Daejeon (KR); Yun Tae Kim, Daejeon (KR)

(73) Assignee: Electronics and Telecommunications Research Institute, (KR)

(*) Notice: Subject to any disclaimer, the term of this patent is extended or adjusted under 35 U.S.C. 154(b) by 323 days.

(21) Appl. No.: 10/721,973

(22) Filed: Nov. 24, 2003

(65) Prior Publication Data

US 2004/0112723 A1 Jun. 17, 2004

(30) Foreign Application Priority Data

Nov. 25, 2002 (KR) ..................... 10-2002-0073471

(51) Int. Cl.
*H01L 47/00* (2006.01)

(52) U.S. Cl. ........................ 257/2; 257/3; 257/4; 257/5

(58) Field of Classification Search ................ 257/2–5
See application file for complete search history.

(56) References Cited

U.S. PATENT DOCUMENTS

| | | | |
|---|---|---|---|
| 5,431,978 | A | 7/1995 | Nakamura et al. |
| 5,789,055 | A | 8/1998 | Yoon |
| 6,373,007 | B1 | 4/2002 | Calcatera et al. |
| 6,570,750 | B1 | 5/2003 | Calcatera et al. |

*Primary Examiner*—Thien F. Tran
(74) *Attorney, Agent, or Firm*—Blakely Sokoloff Taylor & Zafman

(57) ABSTRACT

Provided are an electric switching device with improved reliability and improved speed characteristics and an electric circuit device having the electric switching device. In the electric switching device, a first area is formed on an insulating substrate, and a second area formed on the insulating substrate such as to be a predetermined apart from the first area. The first and second areas contract or expand depending on the intensity of a laser.

12 Claims, 10 Drawing Sheets

ELECTRIC SWITCHING DEVICE AND ELECTRIC CIRCUIT DEVICE HAVING THE SAME

BACKGROUND OF THE INVENTION

This application claims the benefit of Korean Patent Application No. 2002-73471, filed on Nov. 25, 2002, in the Korean Intellectual Property Office, the disclosure of which is incorporated herein in its entirety by reference.

1. Field of the Invention

The present invention relates to a nano-actuator, and more particularly, to an electric switching device that uses a chalcogenide material as a switching medium, and an electric circuit device including the electric switching device.

2. Description of the Related Art

A micromachining technique generally makes it possible to manufacture low priced radio frequency (RF) devices with high performance. Microelectromechanical system (MEMS) RF devices have some advantages, such as, a very low isolation and insertion loss, a consumption of very small power, and a radio frequency exceeding THz. Also, the MEMS RF devices have an operating voltage of about 30 to 50V. If these MEMS RF devices adopts a switching capacitor, they obtain a performance lower than about 0.1 dB at a frequency of 40 GHz when using a low-loss dielectric film and a high conductive metal. A loss at a frequency equal to or greater than 20 Ghz is mainly due to a resistance (Ω) of a metal wiring. The resistance of a switch is usually about 0.25Ω, which is a reasonable value, and can be applied to a phase shifter. An MEMS phase shifter has a far lower loss than a p type-intrinsic-n type(PIN) diode phase shifter or a PIN transistor phase shifter. The loss of such a phase shifter is mainly an ohmic resistance loss.

Examples of a conventional RF switch include a capacitive membrane switch (a type of switching capacitor) or an ohmic contact switch. A shunt RF switch, which is a type of capacitive membrane switch, will be described with reference to FIGS. 1 and 2.

Referring to FIG. 1, a single first RF signal line 12 and a pair of second RF signal lines 14 are disposed in strips on a substrate 10. To be more specific, the first RF signal line 12 is disposed between the two second RF signal lines 14 such that they are spaced apart from one another. The two second RF signal lines 14 are coupled to each other by a beam membrane 16. The beam membrane 16 has the shape of a bridge and intersects the first and second RF signal lines 12 and 14 so that the beam membrane 16 is a predetermined distance above the first RF signal line 12. A portion of the first RF signal line 14 over which the beam membrane 16 crosses is coated with a dielectric film 18. The beam membrane 16 is a predetermined distance above the dielectric film 18. In this structure, an RF signal is applied to the first RF signal line 14. Reference numeral 20*a* denotes a path along which an RF signal is carried when no voltage is applied to the beam membrane 16.

When a direct current (DC) voltage is applied to the beam membrane 16, the beam membrane 16 descends toward the dielectric film 18 because of a difference in potential between the beam membrane 16 and the first RF signal line 12. Consequently, the beam membrane 16 comes into contact with the dielectric film 18. At this time, a metal-insulator-metal (MIM) capacitor is formed among the beam membrane 16, the dielectric film 18, and the first RF signal line 12, such that the RF signal passes through the first RF signal line 12 and discharges into the second RF signal lines 14, which are ground lines. Such a capacitor-typed RF switch provides an isolation of an RF signal that varies depending on the dielectric constant of the dielectric film 18. As the ratio of an on-state capacitance to an off-state capacitance increases, the characteristics of the signal isolation are improved. Hence, the switching speed of the RF switch and the RF signal isolation are improved by using an SBT ($SrBi_2Ta_2O_9$) or BST($(Ba_{1-x}Sr_x)TiO_3$) film with a high dielectric constant as the dielectric film 18.

The durability of the capacitive membrane switch does not depend on its mechanical structure but is shortened due to charging of a dielectric film. In charging of a capacitor membrane switch, charges tunnel through the barrier of a dielectric film due to poole-Frankel emission that occurs at an electric field of 1 to 3 MV/cm. Accordingly, the tunneling charges badly affects an electric field that is necessary to operate the switch, or impedes a release of the switch, which may lead to a slow switching-off. A breakdown voltage of the dielectric film drops since charges trapped in the dielectric film screen an external electric field. Charges may degrade the characteristics of the dielectric film while recombining with each other during several seconds to several days. Such a possibility that the characteristics of the dielectric film of the capacitor membrane switch are degraded can be reduced by lowering an external voltage, that is, by lowering an operating voltage.

However, the driving of a capacitive membrane RF switch at a low voltage weakens the mechanical strength of components that support the RF switch. This creates an advantage of lowering a pull-down voltage, but may weaken the durability of the RF switch.

Also, the capacitor membrane RF switch operates at a switching speed of about 1 μs when a high DC voltage, for example, no less than 20V, is applied.

As described above, since the mechanical durability and pull-down voltage characteristics of membrane RF switches conflict with the speed thereof, an appropriate design of the membrane RF switches is difficult.

SUMMARY OF THE INVENTION

One aspect of the present invention provides a electric switching device including an insulating substrate, a first area formed on the insulating substrate, and a second area formed on the insulating substrate such as to be a predetermined distance apart from the first area. The first and second areas contract or expand depending on the intensity of a laser.

According to one aspect of the invention, the first and second areas are formed of a chalcogenide-family material, and more preferably, formed of Ge—Sb—Te.

According to one aspect of the present invention, the predetermined distance between the first and second areas is wide enough for the first and second areas to contact with each other when expanding. When a 740 nm-wavelength laser with 12 mW intensity is applied to the first and second areas, the first and second areas enter into an amorphous state and expand to contact with each other. When a 740 nm-wavelength laser with 6 mW intensity is applied to the first and second areas, the first and second areas enter into a polycrystalline state and contract to be separated from each other.

According to one aspect of the present invention, a conductive pattern is installed between the insulating substrate and each of the first and second areas, the conductive patterns are apart from each other by a distance smaller than the distance between the first and second areas, and when the first and second areas expand by a received laser, the conductive patterns come into contact with each other. The conductive patterns are formed of aluminum or gold. A groove is formed in a portion of the insulating substrate that is below predetermined portions of the first and second areas so that the first and second areas can expand or contract freely.

Another aspect of the present invention provides an electric circuit device which includes an insulating substrate and a laser radiating means. A plurality of switching transistors including chalcogenide source and drain areas that are a predetermined distance apart from each other are arranged on the insulating substrate. The laser radiating means is installed above the insulating substrate and selectively applies a laser to the switching transistors.

According to another aspect of the invention, a programmable photomask is used as the laser radiating means and includes lower and upper substrates, a liquid crystal layer, a polarization plate, and a laser source. The lower substrate includes a plurality of unit cells, in each of which a thin film transistor and a pixel electrode are formed. The upper substrate is opposite to the lower substrate and includes common electrodes that form electric fields together with the pixel electrodes. The liquid crystal layer is formed between the upper and lower substrates. The polarization plate is attached to an outer surface of each of the upper and lower substrates. The laser source is installed above the upper substrate. The programmable photomask transmits or blocks a laser from the laser source according to an operation of the liquid crystal layer when an electric field is formed between each of the pixel electrodes and each of the common electrodes.

According to another aspect of the invention, the unit cells of the programmable photomask are located directly over the switching transistors.

According to another aspect of the invention, laser diodes are used as the laser radiating means and arranged at regular intervals over the insulating substrate so that one switching transistor is located above one laser diode.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
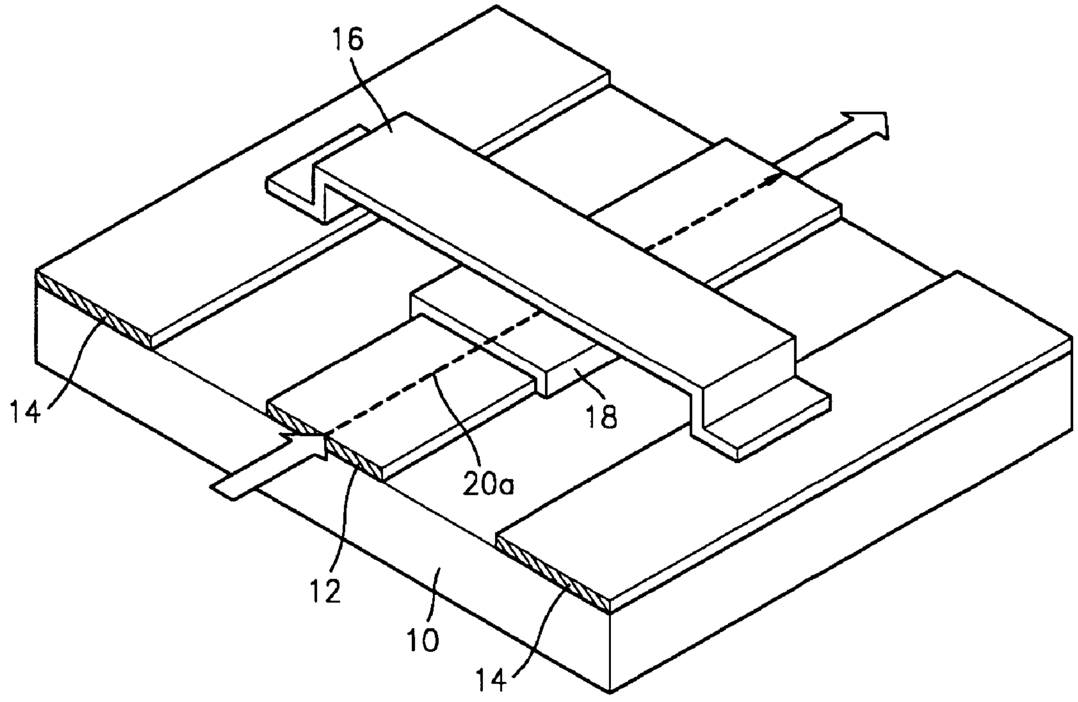
FIG. 1 (PRIOR ART)
FIGS. 1 and 2 are schematic perspective views of a shunt radio frequency (RF) switch, which is a type of conventional capacitive membrane switch.
Figure 2:
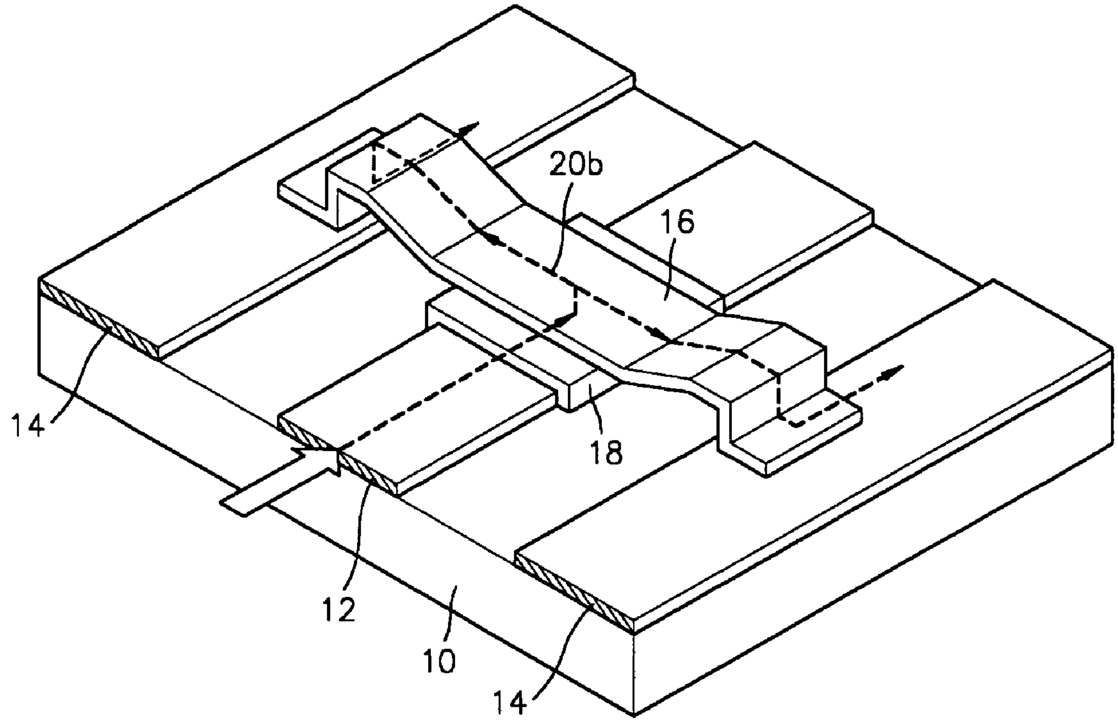
FIG. 2 (PRIOR ART)

Hereinafter, embodiments of the present invention will be described in detail with reference to the attached drawings. The present invention may, however, be embodied in many different forms and should not be construed as being limited to the embodiments set forth herein; rather, these embodiments are provided so that the present disclosure will be thorough and complete, and will fully convey the concept of the invention to those skilled in the art.

In the embodiments of the present invention, a chalcogenide-family material, such as, Ge—Sb—Te used in a phase recording medium, is used as a switching medium, and switching is performed by a contraction or expansion of the switching medium. Before going to the description about a switching device according to the present invention, a contraction and expansion mechanism of a Ge—Sb—Te layer will now be described in detail.

A general phase recording medium includes a semitransparent layer made of aluminium (Al), gold (Au), or the like, a dielectric layer made of ZnS—$SiO_2$ or the like, a phase change layer made of Ge—Sb—Te or the like, and a reflection layer made of Al or the like which are sequentially formed on a polycarbonate substrate. When a laser from a laser diode for radiating a laser with a specific wavelength (e.g., a 650 nm wavelength) is applied to the phase change layer, and the intensity of the laser applied is changed, the state of the phase change layer is changed. If light is applied to the phase change layer with an intensity of 12 mW, the phase change layer has an amorphous state. If light is applied to the phase change layer with an intensity of 6 mW, the phase change layer has a polycrystalline state. The phase change layer in an amorphous state provides a reflectivity of about 2 to 5%, and the phase change layer in a polycrystalline state provides a reflectivity of about 20 to 35%. As a result, the difference in reflectivity between the two different states is about 20 to 30%. Hence, a large optical recording disk is manufactured in a very small area of about several μm, based on the reflectivity difference of the phase change layer.

The repeativity of a change from an amorphous state to a polycrystalline state or vice versa, that is, the repeativity with which writing, erasing, and reading repeat without a decrease in the reflectivity difference, amounts to a maximum of $10^6$. This means that the phase change layer provides reproducibility of $10^6$. The polycrystalline and amorphous states of the phase change layer can be recorded as "1" and "0", respectively, by selecting adequate laser pulse heights and durations for the two states, because there is a contrast between light reflection by the phase change layer in an amorphous state and light reflection by the phase change layer in a polycrystalline state.

Such a phase change is necessarily accompanied with a mechanical deformation of the surface of the phase change layer. The deformation occurs not only upward but also in all directions. In other words, the surface of the phase change layer is deformed three-dimensionally, and accordingly, the phase change layer expands or contracts lengthwise. This theory is presented in a thesis "J.Appl. Phys. 79(10), 15 May 1996" pp. 8084, FIG. 4(*b*).

Expansion of a phase change layer will now be described in relation to the temperature of a phase change material and a length by which the phase change material expands. After the lapse of several nsec at a temperature of about 400° C., the phase change material, Ge—Sb—Te ($Ge_2Sb_{2,3}Te_5$), changes from an amorphous state to a polycrystalline state. The Ge—Sb—Te has a heat capacity of no more than 1.28 $J/cm^3/°$ C., a thermal expansion coefficient of $3\times10^{-6}$ to $8\times10^{-6}/°$ C., and a thermal conductivity of no less than 0.006 $W/cm^3/°$ C. a maximum temperature at which phase change occurs using laser output power is known to reach about 1000° C. A thermal expansion coefficient corresponding to the maximum temperature is a maximum of $8\times10^{-6}/°$ C.×1000° C., that is, $8\times10^{-3}$. This means that the volume of the phase change layer expands 0.8% of the overall volume of a Ge—Sb—Te wiring at a temperature of about 1000° C. However, it is known that the phase change layer actually has a volume expansion coefficient of about 5 to 8%, since the volume expansion coefficient is generally defined as a ratio of a changed volume to an original volume or a ratio of a changed length to an original length based on the fact that a lattice between atoms increases every 1° C. temperature increase. The expansion of a phase change material due to a phase change with a temperature increase is predicted to be far greater than the thermal expansion. When Ge—Sb—Te is used to form a phase change layer, it is predicted that the Ge—Sb—Te layer greatly expands at a rate of 5 to 8% during switching between writing and erasing. In other words, the crystallization state of the Ge—Sb—Te layer varies according to the intensity of a laser beam applied thereto as described above in detail, and an expansion coefficient depends on the temperature. Thus, the Ge—Sb—Te layer may be used as a switching layer.

Figure 3:
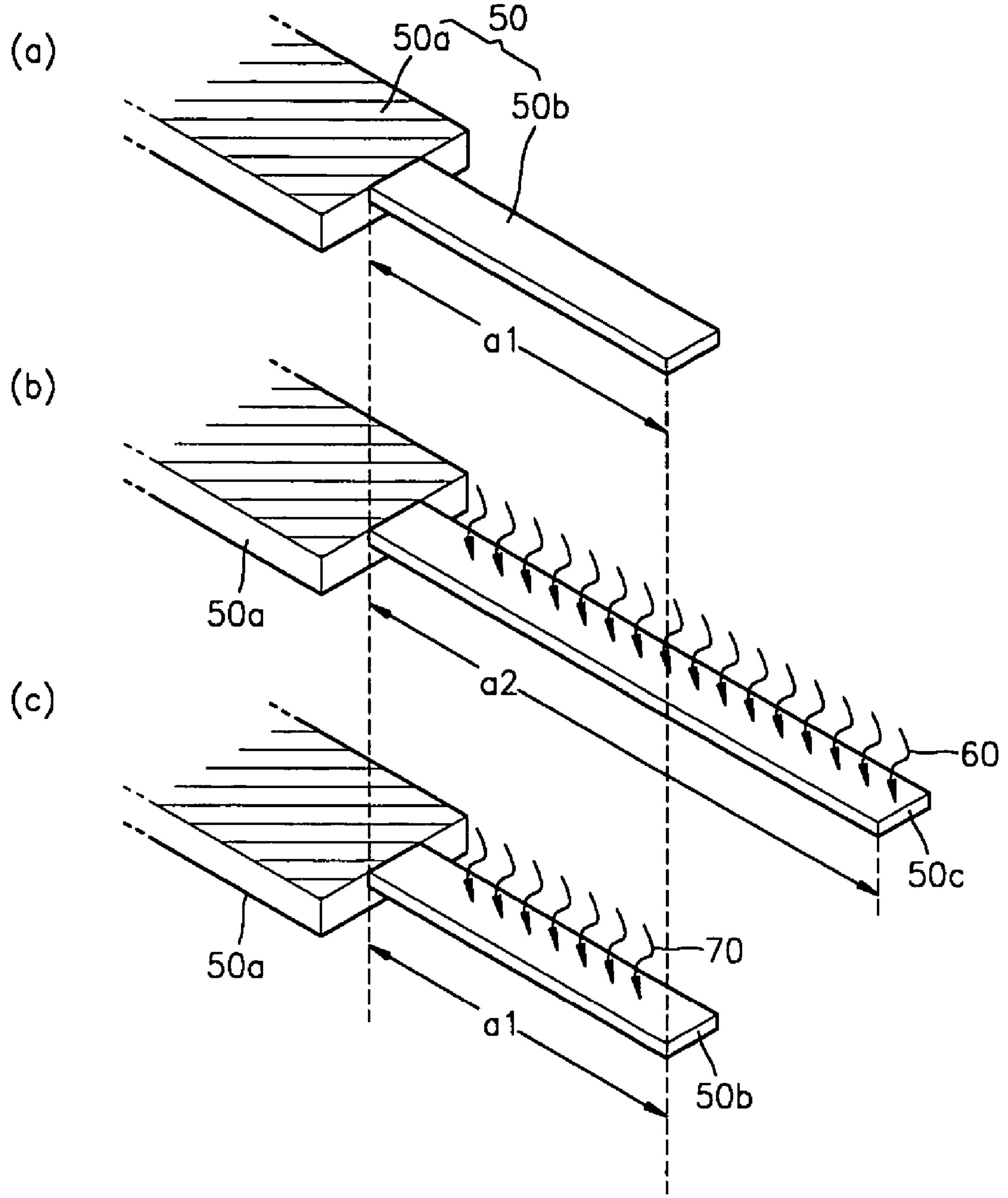
FIG. 3 illustrates an expansion of the volume of a Ge—Sb—Te layer according to the present invention.

FIG. 3 illustrates an expansion of the volume of a Ge—Sb—Te layer according to the present invention. FIG. 3(*a*) shows a Ge—Sb—Te layer in a polycrystalline state, FIG. 3(*b*) shows a Ge—Sb—Te layer in an amorphous state, and FIG. 3(*c*) shows a Ge—Sb—Te layer whose state has returned to a polycrystalline state.

As shown in FIG. 3(*a*), a switching layer 50 is formed of a chalcogenide-family material, such as Ge—Sb—Te. The switching layer 50 has a fixing portion 50*a* and a rod portion 50*b* that extends from the fixing portion 50*a* and is in a free state such as to freely expand and contract. The switching layer 50 of FIG. 3(*a*) is in a polycrystalline state and has the rod portion 50*b* with a length of a1.

As shown in FIG. 3(*b*), when a 12 mW laser beam 60 is applied to the rod portion 50*b* of FIG. 3(*a*), the polycrystalline state of the switching device 50*b* is changed to an amorphous state, and the length of the rod portion 50*b* increases by about 5 to 8% of the overall length of the rod portion 50*b*. Thus, an expanded rod portion 50*c* in an amorphous state is obtained, which has a length of a2.

Thereafter, when a 6 mW laser beam 70 is applied to the expanded rod portion 50*c,* the amorphous state of the rod portion 50*c* is changed back to a polycrystalline state, and accordingly contracted to have the original length of a1 as shown in FIG. 3(*c*).

As described above, the length of the rod portion 50*b* can be changed by applying laser beams with different intensity. Even when such alternate expansion and contraction of the rod portion 50*b* repeat $10^6$ or greater times as described above, the rod portion 50*b* is still reliable.

Figure 4:
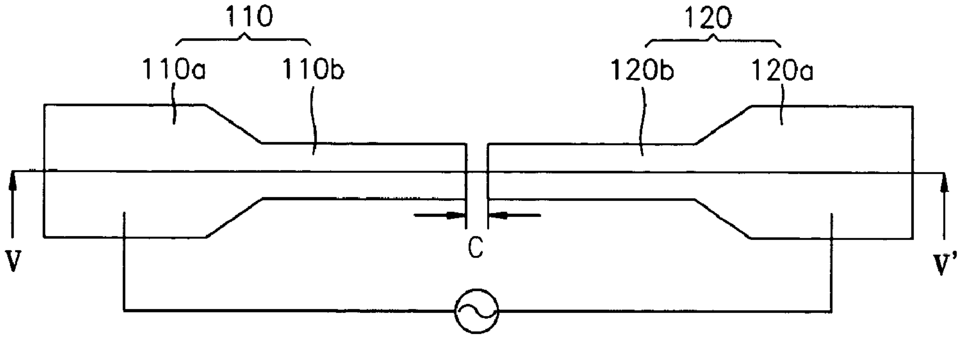
FIG. 4 is a plan view of a switching device according to a first embodiment of the present invention.

FIG. 4 is a top view of a phase switching device according to a first embodiment of the present invention, to which the mechanism of expansion and contraction of the chalcogenide layer of FIG. 3 has been applied. Referring to FIG. 4, first and second areas 110 and 120 are a distance C apart from each other so as to face each other. The first and second areas 110 and 120 are comprised of support portions 110*a* and 120*a,* respectively, and rod portions 110*b* and 120*b,* respectively, which extend from the support portions 110*a* and 120*a,* respectively. The first and second areas 110 and 120 are disposed so that the rod portions 110*b* and 120*b* face each other. An alternating current (AC) or direct current (DC) voltage source is connected to the first and second areas 110 and 120, which respectively may correspond to source and drain areas of a MOS transistor. For example, the first and second areas 110 and 120 are formed of a chalcogenide-family material, such as, Ge—Se—Te that is contracted or expanded by a laser.

Figure 5A:
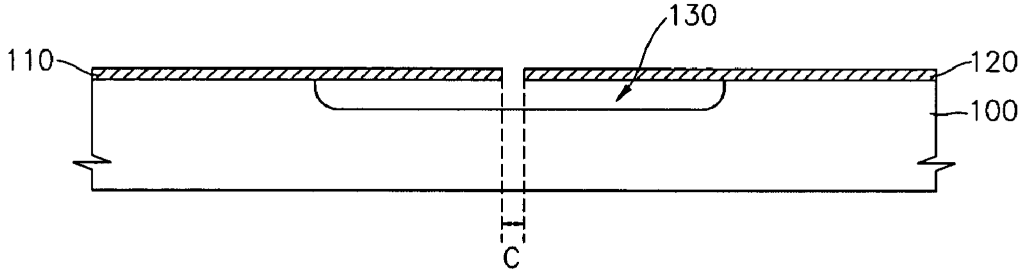
FIGS. 5A and 5B are cross-sections of a phase switching device taken along line V–V' of FIG. 4.
Figure 5B:
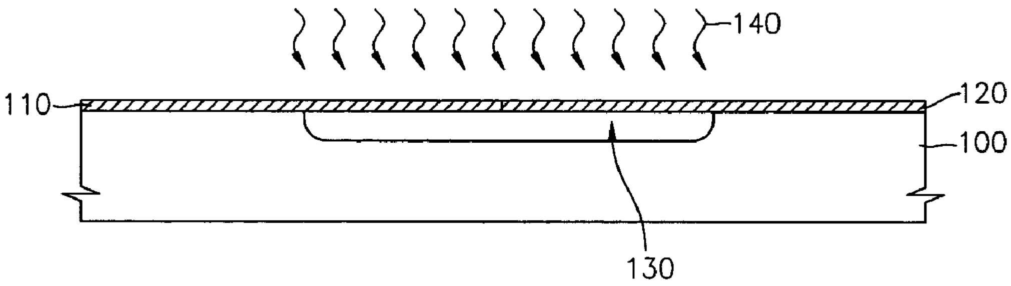

FIGS. 5A and 5B are cross-sections of a phase switching device taken along line V–V' of FIG. 4. FIG. 5A shows the phase switching device of FIG. 4 to which no lasers are applied, and FIG. 5B shows the phase switching device of FIG. 4 to which a laser has been applied.

Referring to FIG. 5A, an insulating substrate 100 is first installed. The first and second areas 110 and 120 are formed in the shape of FIG. 4 on an upper surface of the insulating substrate 100. The first and second areas 110 and 120 are in a polycrystalline state and have a gap "C" therebeween. The gap "C" corresponds to a channel length when the phase switching device is assumed as a MOS transistor. Preferably, the gap "C" is a gap in which the first and second areas 110 and 120 can contact each other when being expanded. The insulating substrate 100 also includes a groove 130 formed under the rod portions 110*b* and 120*b* so that the rod portions 110*b* and 120*b* can freely expand or contract.

Thereafter, as shown in FIG. 5B, a 12 mW laser beam 140 is applied to the rod portions 110*b* and 120*b* of the first and second areas 110 and 120, the rod portions 110*b* and 120*b* enter into an amorphous state. Accordingly, the rod portions 110*b* and 120*b* expand by 5 to 8%, so that they come into contact with each other and that an RF signal current flows in the first area 110 (source area) and the second area 120 (drain area). To cut off the flowing current, a 6 mW laser beam is applied to the rod portions 110*b* and 120*b* to crystallize them. Hence, the rod portions 110*b* and 120*b* contract and are disconnected from each other, so that the RF signal current is cut off. Because the state of the first and second areas 110*b* and 120*b* is switched according to the intensity of an applied laser beam, if the switching device is a MOS transistor, the laser beam plays a role of a gate electrode.

Figure 6A:
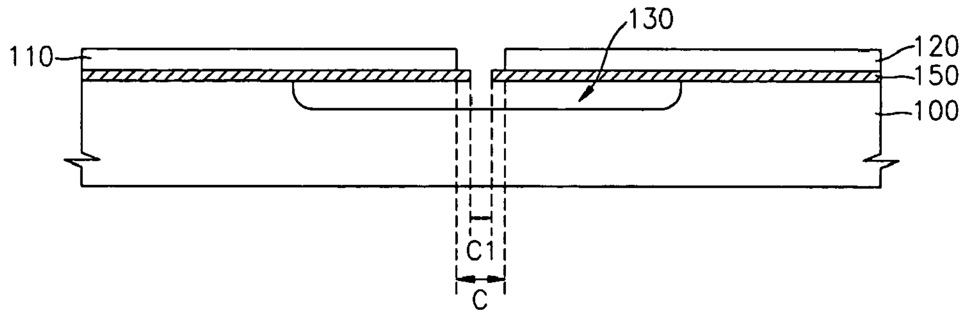
FIGS. 6A and 6B are cross-sections of a phase switching device according to a second embodiment of the present invention.
Figure 6B:
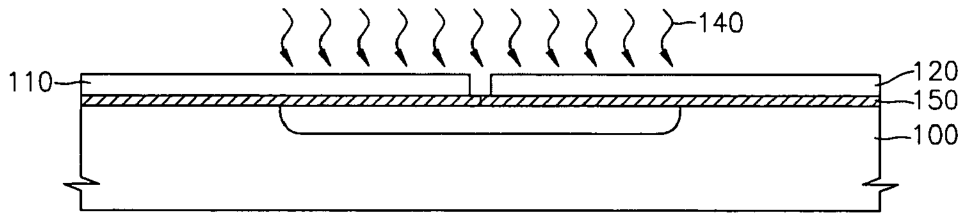

FIGS. 6A and 6B are cross-sections of a phase switching device according to a second embodiment of the present invention. FIG. 6A shows the phase switching device to which no lasers are applied, and FIG. 6B shows the phase switching device to which a laser has been applied.

The phase switching device of FIGS. 6A and 6B is the same as that shown in FIGS. 4 and 5 except that a conductive pattern 150 is further included.

As shown in FIG. 6(*a*), the conductive pattern 150 is formed between the insulating substrate 100 and each of the first and second areas 110 and 120 that are in a polycrystalline state. The conductive pattern 150 can be formed of a metal with a higher conductivity than the chalcogenide-family material of the first and second areas 110 and 120, for example, formed of aluminum (Al) or gold (Au). A gap "C1" in the conductive pattern 150 is narrower than the gap "C" between the first and second areas 110 and 120 since a part of the conductive pattern 150 is also located over the groove 130, it can move freely within the groove 130.

As shown in FIG. 6B, the state of the first and second areas 110 and 120 is changed to an amorphous state by a 12 mW laser beam applied thereto. Accordingly, the first and second areas 110 and 120 expand and become closer to each other. The discontinuous conductive pattern 150, which is formed below the first and second areas 110 and 120 to have a narrower gap than the gap therebetween, receives heat from the first and second areas 110 and 120 and is thus expanded so as to fill up the gap. In other words, the contraction and expansion of the first and second areas 110 and 120 in the second embodiment of the present invention drives the discontinuous conductive pattern 150 to be turned into a continuous conductive pattern 150. Since the conductive pattern 150 has an electric conductivity higher than the conductivity of the chalcogenide-family material, the phase switching device according to the second embodiment of the present invention has higher conductivity than that according to the first embodiment of the present invention.

Figure 7:
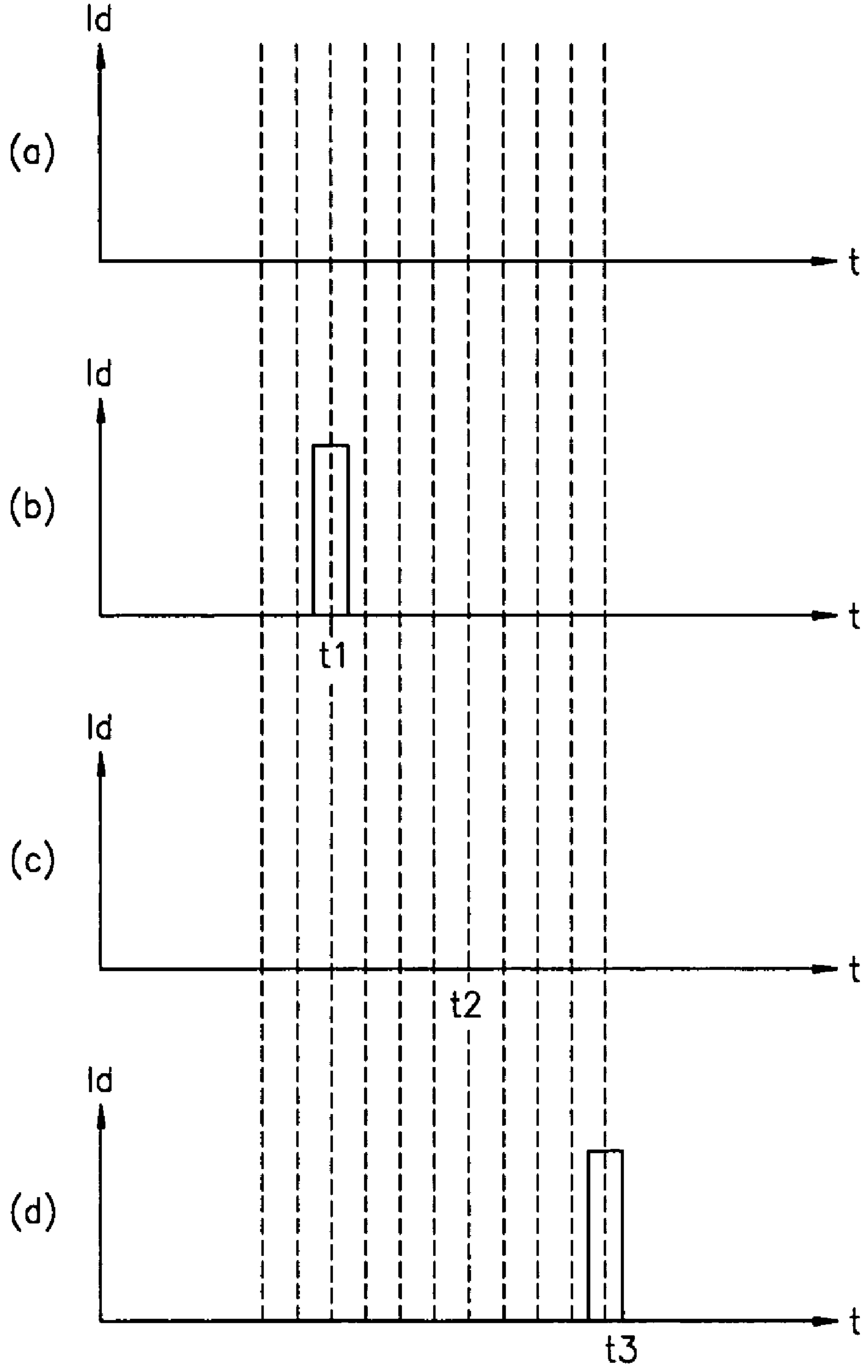
FIG. 7 is a graph for explaining an operation of a switching device according to the present invention.

FIG. 7 is a graph for explaining an operation of a switching device according to the present invention. FIG. 7(*a*) shows a case where no lasers are applied to the first and second areas 110 and 120 of FIG. 5A that are in a polycrystalline state. In FIG. 7(*a*), because the first and second areas 110 and 120 (source and drain areas) are separated from each other, an RF signal voltage is not transferred to the second area 120. In FIG. 7(*b*), a 12 mW laser is applied to the first and second areas 110 and 120 at a point in time "t1", and accordingly, the first and second areas 110 and 120 enter into an amorphous state and come into contact with each other. Then, an RF signal voltage applied to the first area 110 is transferred to the second area 120, and thus the second area 120 generates an RF signal current Id. In FIG. 7(*c*), a 6 mW laser is applied to the first and second areas 110 and 120 at a point in time "t2", and accordingly, the first and second areas 110 and 120 returns to a polycrystalline state and is separated from each other. Then, the transfer of the RF signal voltage from the first area 110 to the second area 120 is stopped, and thus the second area 120 generates no RF signal current Id. In FIG. 7(*d*), a 12 mW laser is applied to the first and second areas 110 and 120 at a point in time "t3", and accordingly, the first and second areas 110 and 120 enter back into an amorphous state and come into contact with each other. Then, the RF signal voltage applied to the first area 110 is transferred to the second area 120, and thus the second area 120 generates the RF signal current Id. Such alternate contraction and expansion of the phase switching device according to the present invention can repeat about $10^6$ times without degrading the reliability of the phase switching device.

Figure 8A:
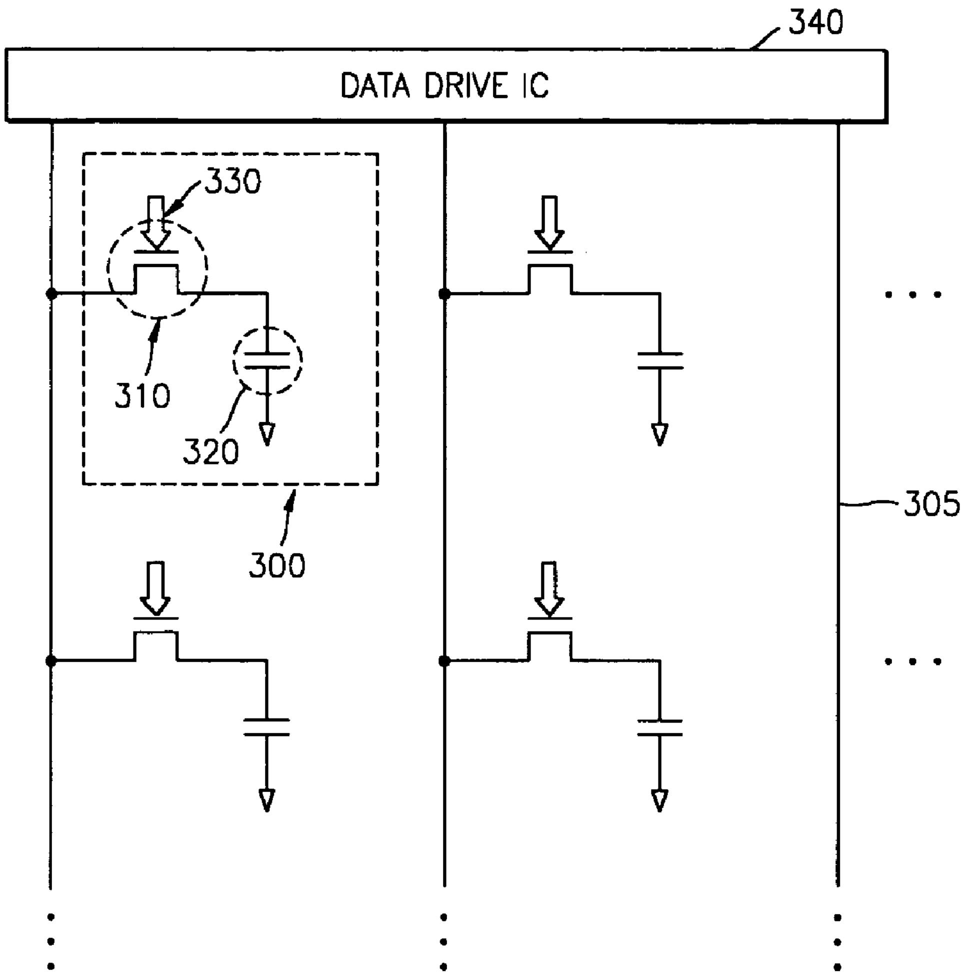
FIG. 8A is a circuit diagram of an electric circuit device having the phase switching device according to the first or second embodiment of the present invention.

FIG. 8A is a circuit diagram of an electric circuit device according to an embodiment of the present invention, having the phase switching device according to the first or second embodiment of the present invention. The electric circuit device of FIG. 8A is a modification of a general active matrix liquid crystal display (LCD) shown in FIG. 8B. The general active matrix LCD will be now be briefly described before going to the description about the electrical circuit device according to the present invention.

Figure 8B:
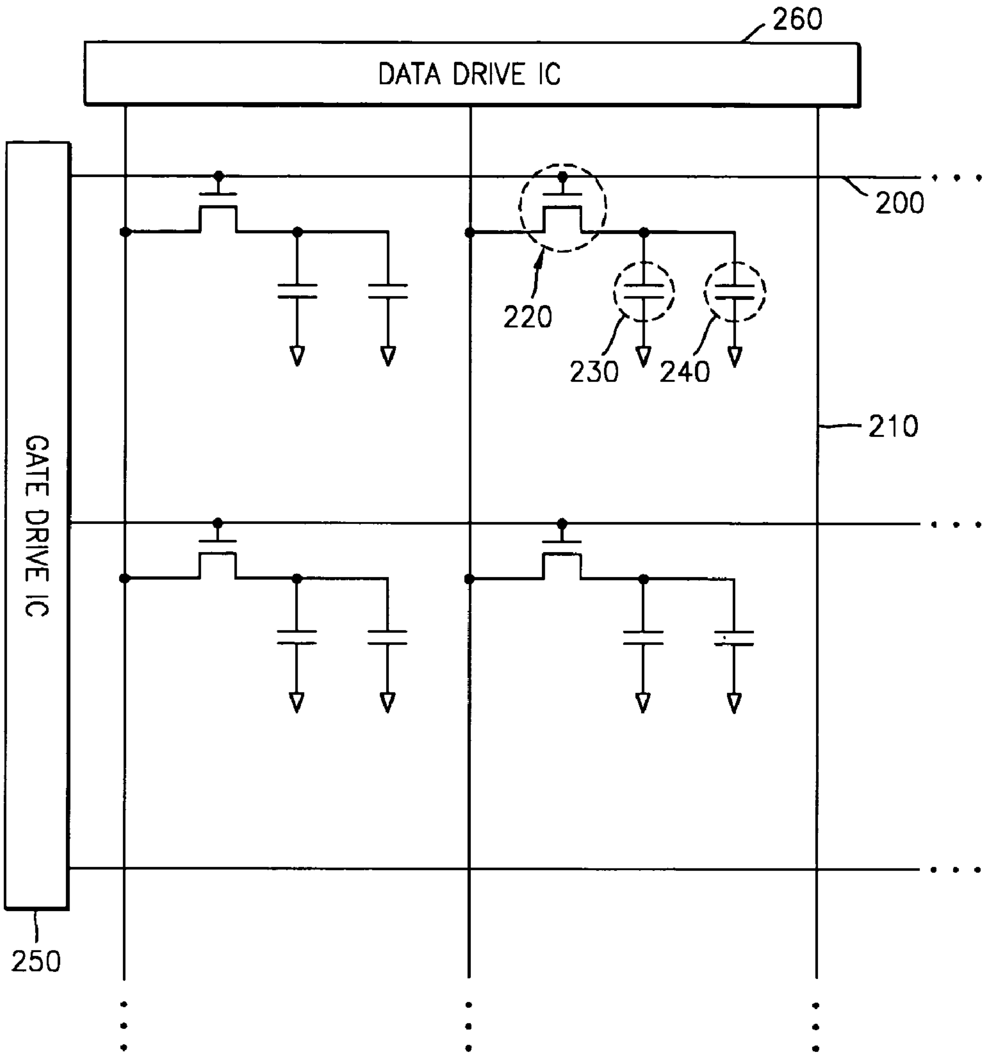
FIG. 8B is a circuit diagram of a conventional active matrix liquid crystal display (LCD)

As shown in FIG. 8B, the general active matrix LCD includes a plurality of gate bus lines 200, a plurality of data bus lines 210 intersecting with the gate bus lines 200, and thin film transistors 220 which are installed at intersecting points of the gate bus lines 200 and the data bus lines 210 the thin film transistors 220 switch on signals carried on the data bus lines 210, when one of the gate bus lines 200 is selected. The general active matrix LCD further includes liquid crystal capacitors 230 connected to the drains of the thin film transistors 220, and auxiliary capacitors 240 connected to the liquid crystal capacitors 230 in parallel. The gate bus lines 200 come out of a gate drive IC 250, and the data bus lines 210 come out of a data drive IC 260.

In the general LCD, when one of the gate bus lines 200 is selected, the signals carried on the data bus lines 210 are switched on by the thin film transistors 220 and drive the liquid crystal capacitors 230, that is, unit cells of the LCD. At this time, the auxiliary capacitors 240 maintain the color of each pixel and the charges of the signals.

Conversely, as shown in FIG. 8A, the electric circuit device according to an embodiment of the present invention includes a plurality of data bus lines 305 arranged at regular intervals. Unit cells 300 are arranged in a matrix on the data bus lines 305. Each of the unit cells 300 includes a switching transistor 310 (which corresponds to a switching device) and a liquid crystal capacitor 320 connected to the drain of the switching transistor 310. The switching transistor 310 is a phase switching device formed of the chalcogenide-family material described in the first embodiment of the present invention. The data bus lines 305 come out of a data drive IC 340. The electric circuit device according to the present invention requires no auxiliary capacitors for maintaining the signals carried on data bus lines, because there is no leakage of charges. In the general electric circuit device, such as a MOS transistor, charges leak because the MOS transistor cannot maintain a great channel resistance. However, in the electric circuit device according to the present invention, the source and drain of a chalcogenide phase switching device are separated from each other, and accordingly, the chalcogenide phase switching device has an infinitely great resistance, so that no charges leak.

Figure 9:
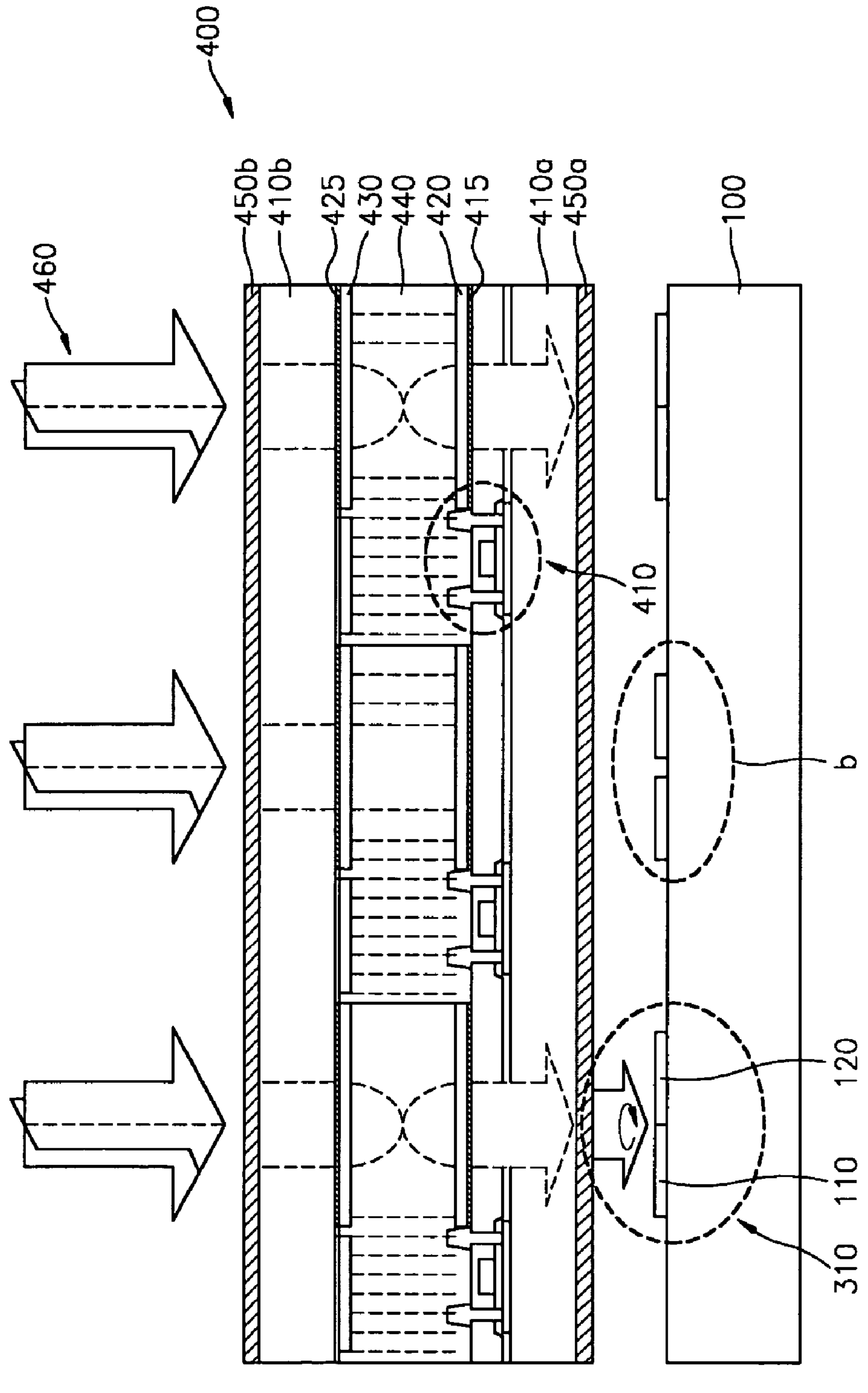
FIG. 9 is a cross-section of the electric circuit device of FIG. 8A which adopts a programmable photomask as a laser radiating means.

In contrast with the general electric circuit device, the electric circuit device according to the present invention includes no gate bus lines and instead includes a laser radiating means 330 for radiating a laser to contract or expand the first and second areas 110 and 120 that form the switching transistor 310. For example, a programmable photomask or a laser diode can be used as the laser radiating means 330. The programmable photomask may be a general active matrix LCD panel, which radiates a laser when liquid crystal molecules operate. The radiated laser is applied to the switching transistor 310 of the electric circuit device. FIG. 9 shows the electric circuit device of FIG. 8A which adopts a programmable photomask 400 as the laser radiating means 330.

As shown in FIG. 9, the switching transistor 310 formed of a chalcogenide-family material, such as, Ge—Sb—Te, is installed on the surface of the insulating substrate 100. As described above, the switching transistor 310 includes the first and second areas 110 and 120 (which are source and drain areas) that are a predetermined distance apart from each other as indicated by reference character "b". In other words, the first and second areas 110 and 120 are in a polycrystalline state.

The programmable photomask 400 is disposed above the insulating substrate 100 including the switching transistor 310, and includes a lower substrate 410*a* and an upper substrate 410*b* located above the lower substrate 410*a*. An array of thin film transistors 410, an array of pixel electrodes 415, and a first rubbing layer 420 are sequentially formed on the upper surface of the lower substrate 410*a*. The pixel electrodes 415 are electrically coupled to the thin film transistors 410 and operate when the thin film transistors 410 are switched on. The first rubbing layer 420 covers the pixel electrodes 415 and controls the initial arrangement of liquid crystal molecules included in a liquid crystal layer 440 to be described later. An array of common electrodes 425 and a second rubbing layer 430 are sequentially formed on the bottom surface of the upper substrate 410*b*. An electric field formed between the common electrodes 425 and the pixel electrodes 415 drives the liquid crystal molecules included in the liquid crystal layer 440, and the second rubbing layer 430 covers the common electrodes 425. The liquid crystal layer 440 including the liquid crystal molecules is located between the lower and upper substrates 410*a* and 410*b*. First and second polarization plates 450*a* and 450*b* for selectively controlling the direction of incident light are attached to the bottom surface of the lower substrate 410*a* and the upper surface of the upper substrate 410*b*, respectively.

The first and second rubbing layers 420 and 430 are vertical orientation layers. Accordingly, when an electric field is not formed between the pixel electrodes 415 and the common electrodes 425, the first and second rubbing layers 420 and 430 vertically orient the liquid crystal molecules of the liquid crystal layer 440. The first and second polarization plates 450*a* and 450*b* are disposed so that their polarization axes cross each other at a right angle. Accordingly, when an electric field is formed between the pixel electrodes 415 and the common electrodes 425, the first and second polarization plates 450*a* and 450*b* block an incident beam 460. The incident beam 460 is incident upon the upper surface of the upper substrate 410*b*. The incident beam 460 may be a laser with an intensity of 12 mW or 6 Mw to control a contraction and expansion of the switching transistor 310. The programmable mask 400 can be formed to have the same size as the insulating substrate 100.

In the operation of the electric circuit device having such a structure, a switching-on operation of a switching transistor 310 will be first described. A 12 mW laser is used as the incident beam 460, and a thin film transistor 410 of the programmable photomask 400 that corresponds to a switching transistor 310 to be switched on is driven to form an electric field between a corresponding pixel electrode 415 and a corresponding common electrode 425. Then, a corresponding cell, that is, the corresponding pixel electrode 415 and liquid crystal molecules, is distorted, and the incident beam 460 passes through the second polarization plate 450*b*, the liquid crystal layer 440, and the first polarization plate 450*a*. Hence, the incident beam 460 reaches the switching transistor 310 to be switched on, so that the switching transistor 310 expands so as to contact first and second areas 110 and 120 with each other.

In a switching-off operation of the switched-on switching transistor 310, a 6 mW laser is used as the incident beam 460, and the thin film transistor 410 of the programmable photomask 400 that corresponds to the switched-on switching transistor 310 is driven to form an electric field between a corresponding pixel electrode 415 and a corresponding common electrode 425. Then, a corresponding cell, that is, the corresponding pixel electrode 415 and liquid crystal molecules, is distorted, and the incident beam 460 passes through the second polarization plate 450*b*, the liquid crystal layer 440, and the first polarization plate 450*a*. Hence, the incident beam 460 reaches the switched-on switching transistor 310, so that the switching transistor 310 contracts so as to separate first and second areas 110 and 120 from each other.

At this time, if another laser is not applied to the first and second areas 110 and 120 in a polycrystalline state, that is, if an electric field is not formed between the corresponding pixel electrode 415 and the corresponding common electrode 425, the switching-off state of the switching transistor 310 is maintained.

Figure 10A:
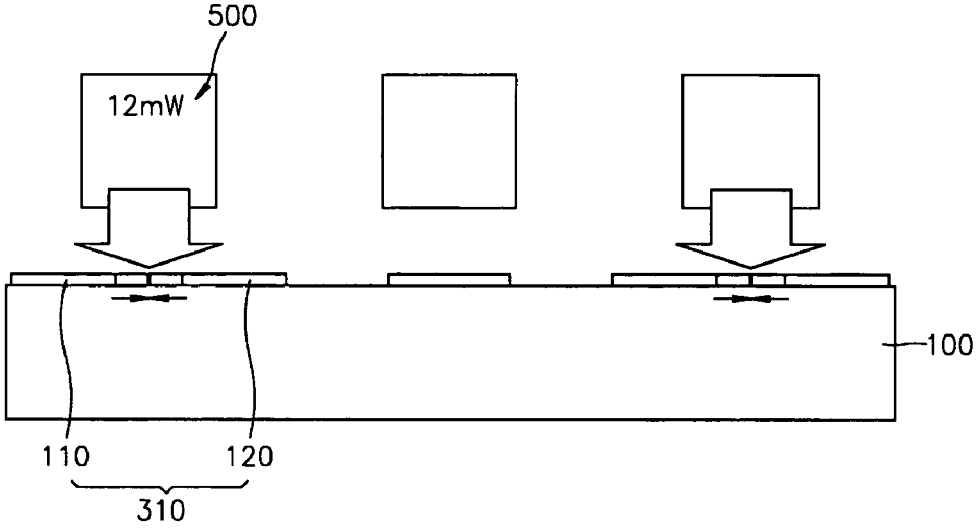
FIG. 10 is a cross-section of the electric circuit device of FIG. 8A which adopts a laser diode as the laser radiating means.
Figure 10B:
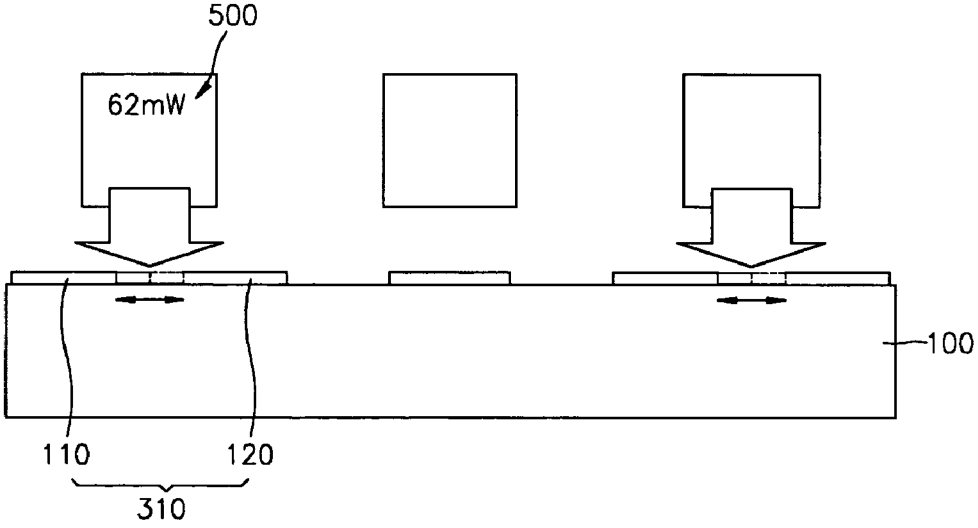

FIGS. 10A and 10B are cross-sections of the electric circuit device of FIG. 8A which adopts laser diodes 500 as the laser radiating means 330. As shown in FIGS. 10A and 10B, the laser diodes 500 are installed above the insulating substrate 100 on which switching transistors 310 each comprised of first and second areas 110 and 120 are formed. The laser diodes 500 are disposed such as to face the switching transistors 310. Each of the laser diodes 500 can be considered as an independent light source. The laser diodes 500 are arranged at regular intervals above the insulating substrate 100 and can become sufficiently compact because they are formed on a wafer (that is, the insulating substrate 100). Also, the laser diodes 500 can be arranged on a high-density switching device.

FIG. 10A shows a case where a 12 mW laser is applied to the first and second areas 110 and 120 of a switching transistor 310, and they expand so as to contact each other. FIG. 10B shows a case where a 6 mW laser is applied to the first and second areas 110 and 120 of a switching transistor 310, and they contract so as to be separated from each other.

As described above, a laser radiating means, for example, a programmable photomask or laser diodes, is disposed above switching transistors so as to apply a laser to the switching transistors, so that switching is performed.

As described above, a switching device according to the present invention uses as a switching medium a chalcogenide-family material that contracts or expands depending on the intensity of a laser. In other words, a switching transistor includes source and drain areas that are a predetermined distance apart from each other and formed of a chalcogenide-family material so that they contact with each other or are separated from each other by a received laser. The chalcogenide-family material is a highly reliable in spite of several times of alternation of contraction and expansion and has high-speed characteristics, for example, several μs. Thus, the chalcogenide-family material can be used to form a next-generation RF switch.

While the present invention has been particularly shown and described with reference to exemplary embodiments thereof, it will be understood by those of ordinary skill in the art that various changes in form and-details may be made therein without departing from the spirit and scope of the present invention as defined by the following claims.

What is claimed is:

1. An electric switching device comprising:

an insulating substrate;

a first area formed on the insulating substrate; and a second area formed on the insulating substrate such as to be a predetermined distance apart from the first area, wherein the first and second areas contract or expand depending on the intensity of a laser.

2. The electric switching device of claim 1, wherein the first and second areas are formed of a chalcogenide-family material.

3. The electric switching device of claim 2, wherein the first and second areas are formed of Ge—Sb—Te.

4. The electric switching device of claim 1, wherein the predetermined distance between the first and second areas is wide enough for the first and second areas to contact with each other when expanding.

5. The electric switching device of claim 4, wherein the first and second areas enter into an amorphous state and expand to contact with each other when a 740 nm-wavelength laser with 12 mW intensity is applied to the first and second areas, and enter into a polycrystalline state and contract to be separated from each other when a 740 nm-wavelength laser with 6 mW intensity is applied to the first and second areas.

6. The electric switching device of claim 1, wherein a conductive pattern is installed between the insulating substrate and each of the first and second areas, the conductive patterns are apart from each other by a distance smaller than the distance between the first and second areas, and when the first and second areas expand by a received laser, the conductive patterns come into contact with each other.

7. The electric switching device of claim 6, wherein the conductive patterns are formed of aluminum or gold.

8. The electric switching device of claim 1, wherein a groove is formed in a portion of the insulating substrate that is below predetermined portions of the first and second areas so that the first and second areas can expand or contract freely.

9. The electric circuit device of claim 8, wherein a programmable photomask is used as the laser radiating means and comprises:

a lower substrate including a plurality of unit cells, in each of which a thin film transistor and a pixel electrode are formed;

an upper substrate opposite to the lower substrate and including common electrodes that form electric fields together with the pixel electrodes;

a liquid crystal layer formed between the upper and lower substrates;

a polarization plate attached to an outer surface of each of the upper and lower substrates; and a laser source installed above the upper substrate, wherein the programmable photomask transmits or blocks a laser from the laser source according to an operation of the liquid crystal layer when an electric field is formed between each of the pixel electrodes and each of the common electrodes.

10. The electric circuit device of claim 9, wherein the unit cells of the programmable photomask are located directly over the switching transistors.

11. An electric circuit device comprising:

an insulating substrate on which a plurality of switching transistors including chalcogenide source and drain areas that are a predetermined distance apart from each other are arranged; and a laser radiating means installed above the insulating substrate, selectively applying a laser to the switching transistors.

12. The electric circuit device of claim 11, wherein laser diodes are used as the laser radiating means and arranged at regular intervals over the insulating substrate so that one switching transistor is located above one laser diode.

* * * * *